United States Patent [19]
Tanaka et al.

[11] Patent Number: 6,159,658
[45] Date of Patent: *Dec. 12, 2000

[54] PHOTOSENSITIVE RESIN COMPOSITION WITH POLYMER HAVING AN IONIC GROUP AND HAVING A POLYMERIZABLE GROUP IN THE SIDE CHAIN AND PRINTING PLATE MATERIALS

[75] Inventors: Shinji Tanaka; Shigetora Kashio; Katsutoshi Sasashita, all of Okazaki, Japan

[73] Assignee: Toray Industries, Inc., Japan

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/814,482

[22] Filed: Mar. 10, 1997

[30] Foreign Application Priority Data

Mar. 19, 1996 [JP] Japan ..................................... 8-063572

[51] Int. Cl.⁷ ..................................................... G03F 7/037
[52] U.S. Cl. .................................... 430/283.1; 430/284.1; 430/287.1; 430/306
[58] Field of Search ............................. 430/283.1, 284.1, 430/287.1, 306

[56] References Cited

U.S. PATENT DOCUMENTS

| 4,263,394 | 4/1981 | Gatos et al. ......................... 430/287.1 |
| 4,511,645 | 4/1985 | Koike et al. ......................... 430/276.1 |
| 5,102,773 | 4/1992 | Littmann et al. .................... 430/283.1 |
| 5,916,731 | 6/1999 | Tanaka et al. ....................... 430/281.1 |

FOREIGN PATENT DOCUMENTS

| 0 204 415 A2 | 12/1986 | European Pat. Off. ......... H05K 3/34 |
| 0 304 383 A2 | 2/1989 | European Pat. Off. .......... G03F 1/00 |
| 0 452 656 | 10/1991 | European Pat. Off. ........ G03F 7/038 |
| 0 539 714 A1 | 5/1993 | European Pat. Off. .......... G03F 7/16 |
| 0 607 962 A1 | 7/1994 | European Pat. Off. ........ G03F 7/033 |
| 06 138 659 | 5/1994 | Japan .............................. G03F 7/028 |

*Primary Examiner*—Mark Chapman
*Attorney, Agent, or Firm*—Austin R. Miller

[57] ABSTRACT

Disclosed are a photosensitive resin composition for printing plate materials, which comprise a polymer having an ionic group and a polymerizable group in the side chain, and a printing plate material as formed by applying the composition onto a support. The hardness of the photosensitive layer of the composition is hardly influenced by temperature and water, and the layer, after having been developed, has good resistance to aqueous ink.

19 Claims, No Drawings

PHOTOSENSITIVE RESIN COMPOSITION WITH POLYMER HAVING AN IONIC GROUP AND HAVING A POLYMERIZABLE GROUP IN THE SIDE CHAIN AND PRINTING PLATE MATERIALS

FIELD OF THE INVENTION

The present invention relates to photosensitive resin compositions for printing plates, and to printing plate materials comprising the composition. In particular, the invention relates to photosensitive resin compositions for aqueous-developable, flexographic printing plate materials with increased impact resilience which are influenced little by working environments.

BACKGROUND OF THE INVENTION

Photosensitive resin compositions comprising, as the carrier resin component, an elastomer of, for example, chlorinated rubber, styrene-butadiene block copolymer or polyurethane, and containing an ethylenic unsaturated compound and a photopolymerization initiator are, owing to the characteristics of the elastomer therein, useful in flexographic printing plate materials; and many such compositions have heretofore been proposed in, for example, U.S. Pat. Nos. 2,948,611 and 3,024,180, and Japanese Patent Publication No. 51-43374.

Solid printing plate materials comprising such photosensitive resin compositions require developing with halogenated hydrocarbons. Therefore, photosensitive resin-containing, solid flexographic printing plate materials capable of being developed with water are desired, and some of such materials have been proposed.

In Japanese Patent Application Laid-Open Nos. 51-53903 and 53-10648, proposed are photosensitive resin compositions comprising a metal or ammonium salt of a carboxyl-having polymer. However, these compositions are problematic in that they are liquid and that they are not satisfactorily water-proof when used in printing plates. In Japanese Patent Application Laid-Open No. 61-22339, proposed is a photopolymerizable composition comprising a salt structure as formed from a carboxyl-having copolymer and a secondary or tertiary nitrogen atom-having vinyl compound. However, this composition is also problematic in that the mechanical strength of the printing plate comprising it is poor and that the composition is difficult to form into a printing plate material having a low hardness. In order to overcome these problems, Japanese Patent Publication No. 5-6178 and U.S. Pat. No. 5,229,434 have proposed photosensitive resin compositions in which carboxyl-having microgel particles form a salt structure with ammonium. Using these compositions, it may be possible to produce printing plate materials which can be developed with water, while having good water-proofness, and which have improved mechanical strength. However, as containing microgel particles, these compositions are still problematic in that the microgel particles remain on the developed surfaces or are dropped off therefrom, thereby roughening the relief edges formed after development with water and resulting in that the image reproducibility in fine relieves is poor.

SUMMARY OF THE INVENTION

The object of the present invention is to provide a photosensitive resin composition suitable for printing plate materials, which is advantageous in that the printing plate material comprising the composition may have good image reproducibility, that the physical properties of the printing plate material are influenced little by the variation in temperature or the presence of water, and that the printing plate material is developable with water and is compatible with aqueous ink.

Specifically, the present invention provides a photosensitive resin composition comprising (A) a polymer having an ionic group and having a polymerizing group in the side chain, and (B) a photo-polymerization initiator.

The invention also provides a photosensitive resin composition comprising (A1) a polymer having an anionic group and having a polymerizing group in the side chain, and (B) a photo-polymerization initiator, provides the use of said composition in printing plate materials developable with alkaline water or surfactant-containing water; provides a printing plate material comprising a photosensitive layer of said photosensitive resin composition as formed on a support; and provides a method for producing a printing plate comprising developing said printing plate material with alkaline water or surfactant-containing water.

The invention further provides a photosensitive resin composition comprising (A1) a polymer having an anionic group and having a polymerizing group in the side chain, (B) a photo-polymerization initiator, and (D) a cationic group-having compound; provides the use of said composition in printing plate materials developable with neutral water; provides a printing plate material comprising a photosensitive layer of said photosensitive resin composition as formed on a support; and provides a method for producing a printing plate comprising developing said printing plate material with neutral water.

PREFERRED EMBODIMENTS OF THE INVENTION

Preferred embodiments of the present invention are described hereinunder. "Weight" as referred to herein means "mass".

It is believed that, when the printing plate material comprising the composition of the invention is developed with water, the polymer of the component (A), which has an ionic group and has a polymerizing group in the side chain, will behave in such a manner that the ionic group in said polymer reacts with the ionic substance, such as surfactant, existing in water to give a salt structure, thereby facilitating the penetration of water into the composition and the removal of the polymer from the composition into water to attain the intended development. Where the composition forms a salt structure comprising an anionic group and a cationic group, it is believed that neutral water may penetrate into the composition to decompose the salt structure, whereby the polymer component existing in the composition may be released out into water.

Where the composition is exposed to light, it is believed that the polymerizable group existing in the side chain of the polymer will form a polymer-to-polymer cross-Linked structure to greatly lower the water-solubility of the thus-crosslinked polymer, whereby the thus-exposed composition may have good water-proofness and therefore becomes resistant to aqueous ink. In this case, in addition, it is also believed that, since the exposed composition has the crosslinked structure in suitable degree, the movement of the polymer existing in the polymer, which may depend on the ambient temperature and humidity, will be limited, resulting in that the printing material comprising the exposed composition is hardly influenced by the working environments.

The polymer of the component (A) for use in the present invention, which has an ionic group and has a polymerizable group in the side chain, is preferably a hydrophobic one. More preferably, the polymer is such that, when it is formed into a film having a thickness of 1 mm, and then dipped in water at room temperature for 24 hours, the film does not substantially dissolve in water while having a degree of swelling with water of not larger than 5% by weight.

The polymer (A) having an ionic group and having a polymerizable group in the side chain is especially preferably a polymer having a linear or grafted structure, or that is, a polymer substantially not having any intramolecular crosslinked structure in the polymer. The polymer of this type may form a film but does not form particles, when it is dissolved in an organic solvent and then the organic solvent is evaporated from the resulting solution. Thus, the polymer of this type is different from polymers having an intramolecular crosslinked structure in that the latter form particles but do not form film.

In the polymer (A) having an ionic group and having a polymerizable group in the side chain, the ionic group is an anionic group or a cationic group but is preferably an anionic group. Of the polymer (A) of that type, a polymer (A1) having an anionic group and having a polymerizable group in the side chain is referred to hereunder.

The anionic group means an anion-having functional group or a functional group capable of releasing an anion through its dissociation, including, for example, a carboxyl group, a sulfonic acid group, a phenolic hydroxyl group, a phosphoric acid group, and their derivatives. Of these, preferred is a carboxyl group.

In the polymer (A1) having such an anionic group and having a polymerizable group in the side chain, the polymerizable group is a functional group capable of forming a crosslinked structure and is, in general, a functional group having an ethylenic unsaturated bond. The group may include, for example, an acryloyl group, a methacryloyl group, and their derivatives.

The polymer (A1) having an anionic group and having a polymerizable group in the side chain may include, for example, addition polymers, polycondensates, polyadducts, and addition condensates. Of these, preferred are polyadducts.

As polyadducts, preferred are urethane bond-having polymers, or that is, polyurethanes. Such polymers may be produced from diisocyanates, anionic group-having polyols and polymerizable group-having polyols through urethanation at the hydroxyl group of the isocyanate moiety.

The diisocyanates may be aromatic, aliphatic, alicyclic or aromatic alicyclic diisocyanates, including, for example, tolylene diisocyanate, diphenylmethane diisocyanate, 3,3'-dimethyldiphenylmethane-4,4'-diisocyanate, phenylene diisocyanate, 1,6-hexamethylene diisocyanate, naphthylene-1,5-diisocyanate, xylylene diisocyanate, tetramethylxylylene diisocyanate, 1,4-tetramethylene diisocyanate, and isophorone diisocyanate.

The anionic group-having polyols are generally compounds having two hydroxyl group and one or more anionic groups in one molecule.

Concretely mentioned are compounds having two hydroxyl groups and one carboxyl group in one molecule, which may include, for example, dimethylolacetic acid, dimethylolpropionic acid, dimethylolbutyric acid, dimethylolvaleric acid, and dimethylolcaproic acid. Further mentioned are sulfonic acid-having polyamidodiols and sulfonic acid-having polyester-diols such as those disclosed in Japanese Patent Application Laid-Open No. 3-206456; and partially acid-modified polyols having carboxyl groups such as those disclosed in Japanese Patent Application Laid-Open No. 5-263060.

The polymerizable group-having polyols are generally compounds having two hydroxyl groups and one or more polymerizable groups in one molecule.

Concretely mentioned are compounds having two hydroxyl groups and one polymerizable group in one molecule, which may include, for example, glycerol mono (meth)acrylate and trimethylolpropane mono(meth)acrylate.

The polymers may comprise, as comonomer components, polyols not having any such anionic group and polymerizable group. The polyols may include, for example, polyalcohols such as ethylene glycol, propylene glycol., 1,4-butanediol, 1,6-hexanediol, diethylene glycol, triethylene glycol, glycerin, trimethylolpropane, and pentaerythritol; polyester polyols such as polycaprolactonediol, polyvalerolactonediol, polyethylene adipate-diol, and polypropylene adipate-diol; polyether polyols such as polyoxyethylene glycol, polyoxypropylene glycol, polyoxyethylene-oxypropylene glycol, and polyoxytetramethylene glycol; and polymer polyols such as hydroxyl-terminated 1,4-polybutadiene, hydrogenated or non-hydrogenated 1,2-polybutadiene, butadiene-styrene copolymer and butadiene-acrylonitrile copolymer.

In addition to the above, also employable are other polyester polyols. For example, mentioned are polyester polyols to be produced through ordinary esterification of polybasic acids such as maleic acid (anhydride), succinic acid (anhydride), adipic acid, fumaric acid, phthalic acid (anhydride), terephthalic acid, isophthalic acid, methyltetrahydrophthalic acid (anhydride), tetrahydrophthalic acid (anhydride), sebacic acid, dodecane-diacid, azelaic acid, glutaric acid, trimellitic acid (anhydride), and hexahydrophthalic acid (anhydride); with aliphatic glycols such as ethylene glycol, propylene glycol, 1,2-butylene glycol, 1,3-butylene glycol, 1,4-butylene glycol, 2,3-butylene glycol, hexylene glycol, decanediol, and neopentylene glycol; or with aliphatic polyether glycols such as diethylene glycol and dipropylene glycol; or with polyalcohols such as glycerin, trimethylolpropane, 1,4-cyclohexanedimethanol, neopentylene glycol hydroxypivalate, and 1,4-hexanediol.

The reaction of the above-mentioned diisocyanates and polyols may be conducted in any ordinary manner. For example, diisocyanates and anionic group-having polyols and also other polyols are dissolved in organic solvents, if desired, and heated with stirring to give the intended polyadducts.

Apart from the above-mentioned method of introducing an anionic group and a polymerizable group into polymers, also employable herein are a method of introducing an anionic group into polymers through grafting, and a method of introducing a polymerizable group into polymers through addition of a compound having an epoxy group and a polymerizable carbon—carbon unsaturated bond to polymers.

Of the polymer having an anionic group and having a polymerizable group in the side chain, the anionic equivalent is preferably from 500 to 4000 g/mol, more preferably from 1000 to 3000 g/mol. If the anionic equivalent is larger than 4000 g/mol, the developability of the composition comprising the polymer with an aqueous developer will be retarded. On the other hand, however, if it is smaller than 500 g/mol, the degree of swelling of the composition with water will be too large, resulting in that the resistance of the developed composition to aqueous ink will be lowered.

Of the polymer having an anionic group and having a polymerizable group in the side chain, the polymerizable group equivalent is preferably from 1000 to 15000 g/mol, more preferably from 1500 to 10000 g/mol. If the polymerizable group equivalent is larger than 15000 g/mol, the ability of the polymer to control the variation in the crosslinked structure of itself will be poor. On the other hand, however, if it is smaller than 1000 g/mol, the hardness of the film of the composition comprising the polymer will be too high. It is desirable that the polymer has 3 or more such polymerizable groups in one molecule.

The molecular weight of the polymer having an anionic group and having a polymerizable group in the side chain is preferably from 1000 to 1000000, in terms of the number-average molecular weight. If its molecular weight is too small, the solidification of the printing plate material comprising the polymer will be retarded. On the other hand, however, if it is too large, the developability of the composition comprising the polymer with an aqueous developer will be poor.

The amount of the polymer having an anionic group and having a polymerizable group in the side chain, to be in the composition of the invention, may be from 10 to 70% by weight, preferably from 15 to 60% by weight, relative to the total weight of the composition. If it is smaller than 10% by weight, the solidification of the printing plate material comprising the composition will be retarded. On the other hand, however, if it is larger than 70% by weight, the developability of the composition with an aqueous developer will be poor.

The resin composition of the present invention may generally contain, as an optional component, an additional component (C) of an ethylenic unsaturated monomer.

As the component (C), employable herein is any addition-polymerizable monomer. Concretely, this may include esters of unsaturated carboxylic acids such as (meth)acrylic acid, for example, alkyl (meth)acrylates such as methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, and stearyl (meth)acrylate; cycloalkyl (meth)acrylates such as cyclohexyl (meth)acrylate; halogenoalkyl (meth)acrylates such as chloroethyl (meth)acrylate and chloropropyl (meth)acrylate; alkoxyalkyl (meth)acrylates such as methoxyethyl (meth)acrylate, ethoxyethyl (meth)acrylate, and butoxyethyl (meth)acrylate; phenoxyalkyl (meth)acrylates such as phenoxyethyl (meth)acrylate and nonylphenoxyethyl (meth)acrylate; alkoxyalkylene glycol (meth)acrylates such as ethoxydiethylene glycol (meth)acrylate, methoxytriethylene glycol (meth)acrylate, and methoxydipropylene glycol (meth)acrylate; alkylene glycol di(meth)acrylates such as ethylene glycol di(meth)acrylate, triethylene glycol di(meth)acrylate, polyethylene glycol di(meth)acrylate, neopentylene glycol di(meth)acrylate, and 1,6-hexanediol di(meth)acrylate; and other unsaturated carboxylates such as trimethylolpropane tri(meth) acrylate, pentaerythritol tetra(meth)acrylate, and dipentaerythritol hexa(meth)acrylate; as well as (meth)acrylamides such as (meth)acrylamide, diacetone(meth) acrylamide, and N,N'-methylenebis(meth)acrylamide. In addition to these, also employable are styrene, vinyltoluene, divinylbenzene and the like.

The amount of the ethylenic unsaturated monomer of the component (C), if any, in the composition is preferably from 10 to 50% by weight, more preferably from 15 to 40% by weight, relative to the total weight of the composition. If the amount is smaller than 10% by weight, the image reproducibility of the printing plate material comprising the composition will be poor. However, if it is larger than 50% by weight, the impact resilience of the printing plate material comprising the composition will be poor.

The resin composition of the present invention may further contain, as an optional component, another additional component (D) of a cationic group-having compound. The printing plate material comprising the photosensitive resin composition that additionally contains such a component (D) is developable with neutral water. Neutral water as referred to herein indicates water not containing any development improver, and may include, for example, city water, river water and well water. This shall not be limited to only pure water.

Cationic group-having ethylenic unsaturated monomers are herein grouped into the component (D) but not in the component (C).

The cationic group means a group having the property of forming a cation through protonic addition thereto, or a functional group having a cation. For this, preferred are amino groups. Especially preferred are tertiary amino groups, aromatic amino groups and quaternary amino groups. Of these, more preferred are tertiary amino groups.

As specific examples of the compound of that type, mentioned are alkylamines such as trimethylamine, triethylamine, and stearyldimethylamine; alcoholamines such as trimethanolamine and triethanolamine; and compounds having amino groups and a polymerizable group, such as 2,2-dimethylaminoethyl (meth)acrylate, 2,2-diethylaminoethyl (meth)acrylate, N,N-diethylaminoethyl (meth)acrylate, and N,N-dimethylaminopropyl (meth)acrylate. These compounds preferably have a molecular weight of smaller than 1000, more preferably not larger than 800.

The amount of the compound of the component (D), if any, in the composition may be from 0.1 to 20% by weight, preferably from 0.5 to 10% by weight, relative to the total weight of the composition. If the amount is smaller than 0.1% by weight, the developability of the composition with an aqueous developer will be poor. However, if it is larger than 20% by weight, the water resistance of the developed composition is often poor.

From different viewpoints, the sum of the ethylenic unsaturated monomer of the component (D) and the ethylenic unsaturated monomer of the component (C), if any, in the composition is preferably from 10 to 50% by weight, more preferably from 15 to 40% by weight. If the sum is smaller than 10% by weight, the image reproducibility of the printing plate material comprising the composition will be poor. However, if it is larger than 50% by weight, the impact resilience of the printing plate material comprising the composition will be poor.

The photosensitive resin composition of the present invention shall contain a photo-polymerization initiator of the component (B). In this, employable is any and every photo-polymerization initiator that has the ability to polymerize polymerizable carbon—carbon unsaturated groups in the presence of light. For this, preferred are those capable of displaying the function to give a radical through autolysis or hydrogen release, after having absorbed light. Examples of these are benzoin alkyl ethers, benzophenones, anthraquinones, benzils, acetophenones, and diacetyls. The amount of the photo-polymerization initiator to be in the composition is preferably from 0.1 to 10% by weight relative to the total weight of the composition.

It is also desirable to further add to the composition of the invention, a polymer having a cationic group, having a polymerizable group in the side chain, and having a number average molecular weight of 1000 or larger as a component (A2). The component (A2), if any, in the composition gives, after having been exposed to light, covalent bonds to the composition, thus causing crosslinking between the component (A1) and the component (A2) via the covalent bonds to thereby improve the printing resistance of the printing plate material comprising the composition.

In the polymer of the component (A2) that has a cationic group and has a polymerizable group in the side chain, the cationic group means a group having the property of forming a cation through protonic addition thereto, or a functional group having a cation. For this, preferred are amino groups. Especially preferred are tertiary amino groups and quaternary amino groups. Of these, more preferred are tertiary amino groups. The polymerizable group therein is a functional group capable of being crosslinked through photopolymerization, and is preferably a (meth)acryloyl group.

The polymer of the component (A2) that has such a cationic group and has such a polymerizable group in the side chain may include, for example, addition polymers, polycondensates, polyadducts, and addition condensates. Of these, preferred are addition polymers to be obtained through addition polymerization.

The addition polymers having a cationic group and having a polymerizable group in the side chain can be obtained through polymerization of monomers having a cationic group in the side chain and having a carbon—carbon unsaturated bond, with monomers having two or more carbon—carbon unsaturated bonds.

However, the polymer obtained in that manner will react with the polymer having an anionic group in the composition through intermolecular crosslinking therebetween to give a gel. In order to prevent this, it is effective to further copolymerize the polymer with a comonomer not having any cationic group in the side chain but having a carbon—carbon unsaturated bond.

It is also effective to introduce a cationic group into the polymer through grafting, or to introduce a (meth)acryloyl group thereinto through addition thereto of a compound having an epoxy group and a polymerizable carbon—carbon unsaturated bond.

As examples of the addition polymers, mentioned are those to be obtained through polymerization of aminoalkyl (meth)acrylate monomers or aminoalkyl (meth)acrylamide compounds with monomers having two or more polymerizable carbon—carbon unsaturated groups. Preferably, the amino group in said monomers is a tertiary one.

More concretely mentioned are dialkylamino (meth) acrylate monomers such as N,N-dimethylaminoethyl (meth) acrylate and N,N-diethylaminoethyl (meth)acrylate; and dialkylaminoalkyl(meth)acrylamide compounds such as N,N-dimethylaminoethyl(meth)acrylamide and N,N-dimethylaminopropyl(meth)acrylamide. Also employable herein are salts of such monomers and compounds to be formed through reaction thereof with, for example, hydrochloric acid, sulfuric acid or acetic acid at their tertiary amino group; and quaternary ammonium salts thereof to be formed through reaction with, for example, alkyl halides or sulfates at their tertiary amino group.

Specific examples of the monomers having two or more polymerizable carbon—carbon unsaturated groups may include monomers having two polymerizable carbon—carbon unsaturated bonds, such as ethylene glycol di(meth) acrylate, diethylene glycol di(meth)acrylate, propylene glycol di(meth)acrylate, tetrapropylene glycol di(meth) acrylate, 1,4-butanediol di(meth)acrylate, di(tetramethylene glycol) di(meth)acrylate, 1,5-pentanediol di(meth)acrylate, 1,6-hexanediol di(meth)acrylate, 3-methyl-1,m5-pentanediol di(meth)acrylate, 1,9-nonanediol di(meth) acrylate, 1,10-decanediol di(meth)acrylate, and their isomers; and monomers having three or more polymerizable carbon—carbon unsaturated bonds, such as trimethylolpropane tri(meth)acrylate, pentaerythritol tri(meth)acrylate, pentaerythritol tetra(meth)acrylate, dipentaerythritol tetra (meth)acrylate, trimethylolheptane tri(meth)acrylate, and their isomers. Two or more of these may be used as combined.

Also employable herein are copolymers comprising the above-mentioned monomers and other comonomers. The comonomers may include, for example, mono(meth) acrylates having a hydroxyl group, such as 2-hydroxymethyl (meth)acrylate, 2-hydroxyethyl (meth)acrylate, and 2-hydroxypropyl (meth)acrylate; alkyl (meth)acrylates such as methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth) acrylate, nonyl (meth)acrylate, decyl (meth)acrylate, undecyl (meth)acrylate, dodecyl (meth)acrylate, tridecyl (meth) acrylate, tetradecyl (meth)acrylate, hexadecyl (meth) acrylate, heptadecyl (meth)acrylate, octadecyl (meth) acrylate, nonadecyl (meth)acrylate, eicosyl (meth)acrylate, heneicosyl (meth)acrylate, docosyl (meth)acrylate, and their isomers; alkoxyalkylene glycol (meth)acrylates such as methoxydiethylene glycol (meth)acrylate, ethoxydiethylene glycol (meth)acrylate, isooctyloxydiethylene glycol (meth) acrylate, phenoxydiethylene glycol (meth)acrylate, phenoxytriethylene glycol (meth)acrylate, methoxytriethylene glycol (meth)acrylate, methoxypolyethylene glycol (meth) acrylate, nonylphenyloctadecylethylene glycol (meth) acrylate, methoxydipropylene glycol (meth)acrylate, and their isomers; as well as (meth)acrylamide, and N-methylol (meth)acrylamide.

Of the monomers not having any cationic group but having one polymerizable carbon—carbon unsaturated bond, preferred are hydroxyl group-having mono(meth) acrylates and alkyl (meth)acrylates. More preferred are alkyl (meth)acrylates in which the alkyl moiety has 6 or more carbon atoms.

As examples of the polymers having such a cationic group and a (meth)acryloyl group in the side chain, mentioned are those comprising the following structural formulae (I) to (IV):

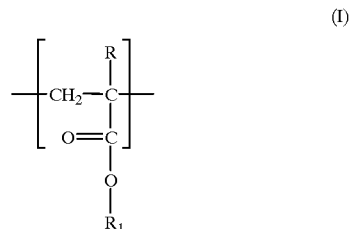

(I)

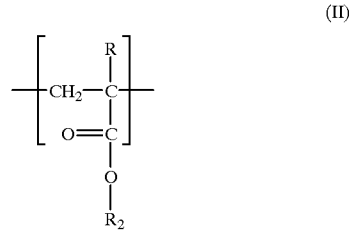

(II)

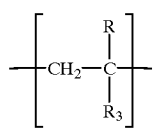

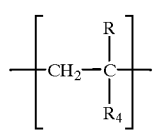

wherein R represents a hydrogen atom or a methyl group; $R_1$ represents an alkyl group, a cyclic alkyl group, or an alkyl ether group; $R_2$ represents a (meth)acryloyl-having group; $R_3$ represents a cationic group-having group; and $R_4$ represents an alcoholic hydroxyl-having group. Preferably, the proportion of (I) is from 20 to 90 mol %; that of (II) is from 0.5 to 10 mol %; that of (III) is from 5 to 70 mol %; and that of (IV), though not indispensable, is from 0 to 60 mol %. The polymers may be either random copolymers or block copolymers composed of these structures.

If the proportion of (I) is smaller than 20 mol %, the water-proofness of the printing plate material comprising the polymer will be poor; but if it is larger than 90 mol %, the developability thereof with an aqueous developer will be poor. If the proportion of (II) is smaller than 0.5 mol %, the ability of the polymer to improve the resistance to aqueous ink of the printing plate material comprising it will be poor; but if it is larger than 10 mol %, the hardness of the printing plate material comprising it will be too large to have a satisfactory degree of softness suitable to flexographic printing plates. If the proportion of (III) is smaller than 5 mol %, the developability with an aqueous developer of the printing plate material comprising the polymer will be unfavorably retarded; but if it is larger than 70 mol %, the water-proofness of the printing plate material comprising it will be poor. If the proportion of (IV) is larger than 60 mol %, the water-proofness of the printing plate material comprising the polymer will be poor.

The amount of the polymer having a cationic group and a polymerizable group in the side chain, to be in the composition of the invention, is preferably from 1 to 60% by weight, more preferably from 3 to 50% by weight, relative to the total weight of the composition. If the amount is too small, the polymer could not satisfactorily exhibit its ability to improve the printing resistance of the printing plate material comprising it. On the other hand, however, if it is too large, the degree of swelling with water of the printing plate material comprising it will increase.

The resin composition of the present invention may further contain a plasticizer, apart from the components (A), (A1), (A2), (B), (C) and (D). The plasticizer is not specifically defined, provided that it has the general property of softening printing plate materials, but is preferably one that is well miscible with polymers having an anionic group and having a polymerizable group in the side chain. More preferred are compounds having an ester bond, which may include, for example, phthalates, phosphates, sebacates, adipates, and polyesters having a molecular weight of from 1000 to 3000. The amount of the plasticizer, if any, in the composition may be from 3 to 40% by weight, preferably from 5 to 35% by weight, relative to the total weight of the composition.

In addition, the resin composition may further contain any other polymers that are different from those defined for the components (A) to (D). For example, the addition to the composition of polyene compounds that are liquid at room temperature are effective for enhancing the miscibility of the constitutive components with each other. As such compounds, preferably used are those having a number-average molecular weight of from 500 to 50000. For those, concretely mentioned are polybutadiene, polyisoprene and their derivatives as derived from such polyenes owing to the reactivity of the terminal group or the molecular chain thereof, which have no substantial crystallinity and which are liquid at room temperature. Examples of the derivatives may include intramolecular or terminal maleates, epoxides, acryloylates and methacryloylates. The amount of the polyene compound, if any, in the composition is preferably from 1 to 15% by weight relative to the total amount of the composition. In order to improve the water-proofness and the impact resilience of the printing plate material comprising the composition of the invention, an elastomer that is solid at room temperature may also be added to the composition. As the elastomer, for example, usable are natural rubber and synthetic rubber. Specific examples of the elastomer may include nitrile rubber, butyl rubber, acrylic rubber, epichlorohydrin rubber, silicone rubber, urethane rubber, ethylene-propylene copolymer, urethane elastomer, ester elastomer, and chlorinated polyethylene. Where such an elastomer that is solid at room temperature is added to the composition, its amount may be effectively from 1 to 50% by weight, more effectively from 10 to 40% by weight, relative to the total weight of the composition. Also effective is the addition of a solid polyolefin such as polymethylterpene.

In order to enhance the stability of the photosensitive resin composition of the present invention during preparing or storing it, a small amount of a polymerization inhibitor may be added to the composition. As the polymerization inhibitor, concretely mentioned are phenols, hydroquinones, catechols, and phenothiazines. The thermal stabilizer of that type may be added to the composition in an amount of from 0.001 to 5% by weight relative to the total weight of the composition.

Any other additives, such as dye, pigment, ultraviolet absorbent and fragrance, may also be added to the composition of the invention.

To produce the photosensitive resin composition of the present invention, the constitutive components such as those mentioned hereinabove are dissolved in an organic solvent, such as toluene, xylene, acetone, methyl ethyl ketone, ethyl acetate or butyl acetate, and the solvent is evaporated from the resulting solution. Alternatively, the constitutive components are put into a mixing machine, such as a kneader, and kneaded therein under heat to give the composition of the invention.

The photosensitive resin composition of the invention may be applied onto a support to produce a printing plate material. For example, a solution of the composition is directly spread over a support and then evaporated to dryness to form a photosensitive layer on the support. In a different method, the solution is directly spread over a cover film and then evaporated to dryness, and the film thus having a photosensitive layer thereon is attached onto a support with the layer facing to the support. As still different methods, a photosensitive layer comprising the composition, which is prepared by evaporating the organic solvent from the solution comprising the composition, is pressed with a hot press to give a sheet, and this sheet is laminated between a support and a cover film; or the solution comprising the composition is extruded out through the T-die of a single-screw or double-screw extruder to give a sheet of the composition.

In the thus-obtained printing plate material having such a photosensitive layer of the composition of the invention, in general, it is desirable that the photosensitive layer is covered with a thin film layer consisting essentially of a water-soluble or water-dispersible resin to thereby improve the adhesiveness between the printing plate material and a negative film.

As the support, for example, employable are metal sheets of, for example, steel, stainless steel, aluminium or copper that may optionally have an adhesive layer thereon, as well as plastic sheets such as polyester films, and synthetic rubber sheets. On the support, the photosensitive layer is formed generally at a thickness of from 0.1 to 10 mm.

Where the photosensitive resin composition of the present invention is used to form a relief image for printing, a negative or positive original image film is kept in close contact with a photosensitive layer of the composition, which is prepared on a support in the manner as above, and ultraviolet rays generally having an wavelength of from 300 to 450 nm or therearound are irradiated thereonto, for example, from a high-pressure mercury lamp, an extra-high-pressure mercury lamp, a metal halide lamp, a xenon lamp, a chemical lamp or a carbon-arc lamp, to thereby cure the photosensitive layer through photoreaction. Next, the non-cured part is dissolved out or dispersed out into an aqueous developer, using a spray-type developing machine or a brush-type developing machine. As a result of this process, a relief is formed on the support. If desired, this is dried and then processed with active rays in air or in a vacuum to obtain a printing plate.

Where the photosensitive resin composition not containing the component (D) and the component (A2) is developed, alkaline water or water containing a surfactant can be used as the developer. On the other hand, where the photosensitive resin composition containing the component (D) and the component (A2) is developed, neutral water can be used as the developer. Therefore, if it is desired to use neutral water containing no additional component as the developer, in consideration of the influence of the developer on the environment, it is recommended to add the component (D) and the component (A2) to the photosensitive resin composition of the invention.

The printing plate as produced by the use of the photosensitive resin composition of the present invention has a Shore A hardness of from 30 to 70 and has good impact resilience. Therefore, it is suitably used as a printing plate for flexographic printing.

REFERENCE EXAMPLE

Polytetramethylene ether glycol (having a molecular weight of 2000), tolylene diisocyanate, dimethylolpropionic acid (this is not added to A-5), and glycerin (mono) methacrylate (this is not added to A-4) were subjected to addition polymerization in methyl ethyl ketone. Thus were prepared herein polymers (A-1) to (A-5) having an anionic group and having a polymerizable group in the side chain, all as solutions in methyl ethyl ketone. A-4 had no double bond; and A-5 had no carboxyl group.

Polytetramethylene ether glycol (having a molecular weight of 2000), a polyester made from ε-caprolactone, methylpentanediol and adipic acid, tolylene diisocyanate, dimethylolpropionic acid, and glycerin (mono)methacrylate were subjected to addition polymerization in methyl ethyl ketone to obtain a solution in methyl ethyl ketone of a polymer (A-6) having an anionic group and having a polymerizable group in the side chain.

The characteristics of the polymers prepared herein are shown in Table 1.

On the other hand, as shown in Table 2, polymers (E-1) and (E-2) having a cationic group and a (meth)acryloyl group were prepared through radical polymerization. The data in these tables are in terms of mol %. The molecular weight as referred to herein was obtained according to gel permeation chromatography (GPC), based on polystyrene in a solvent of tetrahydrofuran.

TABLE 1

| | Carboxyl Equivalent g/mol | Double bond Equivalent g/mol | Solid Content % | Concentration of Solution csp |
|---|---|---|---|---|
| A-1 | 1370 | 8190 | 30.1 | 1700 |
| A-2 | 1385 | 4010 | 29.3 | 1170 |
| A-3 | 1600 | 2010 | 30.1 | 1200 |
| A-4 | 1500 | 0 | 30.0 | 1460 |
| A-5 | 0 | 8100 | 30.1 | 1250 |
| A-6 | 1380 | 4000 | 30.2 | 2070 |

TABLE 2

| | LMA | SMA | 2-HEMA | DM | TMP | Mn/1000 | Amine Value(*1) |
|---|---|---|---|---|---|---|---|
| E-1 | 37.5 | 0.0 | 37.5 | 20.0 | 5.0 | 2.9 | 55.3 |
| E-2 | 0.0 | 37.5 | 47.5 | 10.0 | 5.0 | 3.1 | 24.6 |

Notes:
LMA: Lauryl methacrylate
SMA: Stearyl methacrylate
2-HEMA: 2-Hydroxyethyl methacrylate
DM: N,N-dimethylaminoethyl methacrylate
TMP: Trimethylolpropane trimethacrylate
Mn: number-average molecular weight
(*1): mg KOH/g Example 1

A laboratory kneader having a volume of about 100 cc, Laboplastmill" Model C (produced by Toyo Seiki KK) was preheated at 90° C., to which were added 31.5 parts of A-1 and 13.0 parts of E-1 and kneaded at 30 rpm. A cationic compound of N,N-dimethylaminopropylmethacrylamide (4.2 parts), ethylenic unsaturated monomers of lauryl acrylate (17.9 parts) and polycarbonate diacrylate having a molecular weight of 800 (3.2 parts), and a plasticizer of di(2-ethylhexyl) phthalate (this may be referred to as dioctyl phthalate) (21.0 parts) were added to the kneader; and finally a photo-polymerization initiator of benzyldimethylketal (2.1 parts) was added thereto. These were kneaded for about 10 minutes to obtain a photosensitive resin composition. This was taken out of the kneader, and was sandwiched between a 125 μm-thick polyester support which had been pre-coated with a polyester adhesive and cured, and a 100 μm-thick polyester cover film having thereon a slip coat layer of polyvinyl alcohol, and pressed, using a pressing machine heated at 100° C. Thus was obtained herein a printing plate material having a 3 mm-thick photosensitive layer.

The thus-obtained printing plate material was exposed to light toward the surface of the support thereof for 30 seconds, using an exposing device having 15 20-W chemical lamps as disposed in parallel therein, the distance between the surface of the support and the light source being 15 cm. Next, the cover film was peeled off, and a negative film was airtightly attached onto the photosensitive layer of the plate material. This was again exposed to light through the negative film for 6 minutes, using the same exposing device.

After the exposure, this was developed in a brush-type washer containing neutral water (liquid temperature: 400°

C.). After thus developed for 10 minutes, a relief image having a depth of 670 μm was formed, which was faithful to the negative film. The printing plate thus obtained herein had a good image profile, without having any undesirable small hills or holes on the surface and the edges of the relief formed.

Using aqueous ink, this printing plate was subjected to a flexographic printing test to give 500,000 prints. After the test, neither the relief edges were broken nor the relief surface was roughened, and the prints obtained were all good.

The composition used in producing this printing plate is shown in Table 3. Table 4 shows the developing speed, the relief profile, the degree of swelling with water, the Shore A hardness, the modulus of rubber elasticity, and the results of the flexographic printing test.

Examples 2 to 7, Comparative Examples 1 to 3

Using the compositions shown in Table 3, printing plate materials were produced in the same manner as in Example 1. The thus-obtained printing plate materials were exposed in the same manner as in Example 1, and then developed to have a relief depth of about 700 μm. As in Example 1, Table 4 shows the developing speed, the relief profile, the degree of swelling with water, the Shore A hardness, the modulus of rubber elasticity, and the results of the flexographic printing test.

Example 8

A laboratory kneader having a volume of about 100 cc, Laboplastmill" Model C (produced by Toyo Seiki KK) was preheated at 90° C., to which was added 33.0 parts of A-1 and kneaded at 30 rpm. Ethylenic unsaturated monomers of lauryl acrylate (19.8 parts) and polycarbonate diacrylate having a molecular weight of 800 (2.2 parts), and a plasticizer of di(2-ethylhexyl) phthalate (this may be referred to as dioctyl phthalate) (27.5 parts) were added to the kneader; and finally a photo-polymerization initiator of benzyldimethylketal (2.2 parts) was added thereto. These were kneaded for about 10 minutes to obtain a photosensitive resin composition. This was taken out of the kneader, and was sandwiched between a 125 μm-thick polyester support which had been pre-coated with a polyester adhesive and cured, and a 100 μm-thick polyester cover film having thereon a slip coat layer of polyvinyl alcohol, and pressed, using a pressing machine heated at 100° C. Thus was obtained herein a printing plate material having a 3 mm-thick photosensitive layer.

The thus-obtained printing plate material was exposed to light toward the surface of the support thereof for 30 seconds, using an exposing device having 15 20-W chemical lamps as disposed in parallel therein, the distance between the surface of the support and the light source being 15 cm. Next, the cover film was peeled off, and a negative film was airtightly attached onto the photosensitive layer of the plate material. This was again exposed to light through the negative film for 6 minutes, using the same exposing device.

After the exposure, this was developed in a brush-type washer containing neutral water to which had been added a surfactant of sodium laurylbenzenesulfonate in an amount of 1% (liquid temperature: 40° C.). After thus developed for 10 minutes, a relief image having a depth of 720 μm was formed, which was faithful to the negative film. The printing plate thus obtained herein had a good image profile, without having any undesirable small hills or holes on the surface and the edges of the relief formed.

Using aqueous ink, this printing plate was subjected to a flexographic printing test to give 500,000 prints. After the test, neither the relief edges were broken nor the relief surface was roughened, and the prints obtained were all good.

The composition used in producing this printing plate is shown in Table 3. Table 4 shows the developing speed, the relief profile, the degree of swelling with water, the Shore A hardness, the modulus of rubber elasticity, and the results of the flexographic printing test.

Examples 9 and 10, Comparative Example 4

Using the compositions shown in Table 3, printing plate materials were produced in the same manner as in Example 8. The thus-obtained printing plate materials were exposed in the same manner as in Example 8, and then developed to have a relief depth of about 700 μm. As in Example 8, Table 4 shows the developing speed, the relief profile, the degree of swelling with water, the Shore A hardness, the modulus of rubber elasticity, and the results of the flexographic printing test.

TABLE 3

|  | Polymer A | Polymer E | DMAPMA | L-A | TD | PCDA | PTMGA | TMP | DOP | IC-651 |
|---|---|---|---|---|---|---|---|---|---|---|
| Example 1 | 31.5 (A-1) | 13.0 (E-1) | 4.2 | 17.9 | 0 | 3.2 | 0.0 | 0 | 21.0 | 2.1 |
| Example 2 | 31.5 (A-1) | 0.0 | 4.2 | 17.9 | 0 | 3.2 | 0.0 | 0 | 21.0 | 2.1 |
| Example 3 | 31.5 (A-1) | 13.0 (E-1) | 4.2 | 17.9 | 0 | 0.0 | 3.2 | 0 | 21.0 | 2.1 |
| Example 4 | 33.0 (A-1) | 5.5 (E-1) | 4.4 | 19.8 | 0 | 2.2 | 0.0 | 0 | 27.5 | 2.2 |
| Example 5 | 33.0 (A-2) | 5.5 (E-1) | 4.4 | 19.8 | 0 | 2.2 | 0.0 | 0 | 27.5 | 1.5 |
| Example 6 | 33.0 (A-3) | 5.5 (E-1) | 4.4 | 19.8 | 0 | 1.1 | 0.0 | 0 | 27.5 | 1.5 |
| Example 7 | 33.0 (A-2) | 5.5 (E-2) | 4.4 | 19.8 | 0 | 2.2 | 0.0 | 0 | 27.5 | 1.5 |
| Comp. Example 1 | 32.2 (A-4) | 13.4 (E-1) | 4.3 | 17.9 | 0 | 0.0 | 6.0 | 0 | 23.9 | 2.4 |
| Comp. Example 2 | 33.0 (A-5) | 5.5 (E-1) | 4.4 | 19.8 | 0 | 2.2 | 0 | 0 | 27.5 | 2.2 |
| Comp. Example 3 | 33.0 (A-1) | 0.0 | 0 | 19.8 | 0 | 2.2 | 0 | 0 | 27.5 | 2.2 |
| Example 8 | 33.0 (A-1) | 0 | 0 | 19.8 | 0 | 2.2 | 0 | 0 | 27.5 | 2.2 |
| Example 9 | 54.8 (A-2) | 0 | 0 | 0 | 22.7 | 0 | 0 | 0 | 20.6 | 1.7 |
| Example 10 | 48.3 (A-6) | 0 | 0 | 0 | 20.0 | 0 | 0 | 3 | 18.2 | 1.5 |

TABLE 3-continued

|  | Polymer A | Polymer E | DMAPMA | L-A | TD | PCDA | PTMGA | TMP | DOP | IC-651 |
|---|---|---|---|---|---|---|---|---|---|---|
| Comp. Example 4 | 33.0 (A-4) | 0 | 0 | 19.8 | 0 | 2.2 | 0 | 0 | 27.5 | 2.2 |

Notes:
DMAPMA: N,N-dimethylaminopropylmethacrylamide
L-A: Lauryl acrylate
PCDA: Polycarbonate diacrylate (molecular weight: 800)
PTMGA: Polytetramethylene ether glycol diacrylate (molecular weight: 650)
DOP: Di(2-ethylhexyl) phthalate (Dioctyl phthalate)
IC-651: Benzyldimethylketal (produced by Ciba-Geigy)
TD: Tridecyl methacrylate
TMP: Trimethylolpropane trimethacrylate

TABLE 4

|  | Developing Speed | | Degree of Swelling with | Shore A Hardness | | | Modulus of Rubber | |
|---|---|---|---|---|---|---|---|---|
|  | µm/min | Relief | Water | A | B | C | Elasticity (%) | Printing Test |
| Example 1 | 67 | ○ | 1.8 | 66 | 55 | 61 | 40 | ○ |
| Example 2 | 101 | ○ | 1.8 | 69 | 56 | 63 | 54 | Δ |
| Example 3 | 90 | ○ | 2.7 | 66 | 54 | 57 | 42 | ○ |
| Example 4 | 58 | ○ | 1.8 | 61 | 48 | 56 | 48 | ○ |
| Example 5 | 48 | ○ | 1.3 | 66 | 53 | 65 | 46 | ○ |
| Example 6 | 158 | ○ | 1.2 | 69 | 60 | 68 | 40 | ○ |
| Example 7 | 82 | ○ | 1.3 | 64 | 54 | 61 | 47 | ○ |
| Comparative Example 1 | 35 | ○ | 3.3 | 62 | 35 | 42 | 43 | ○ |
| Comparative Example 2 | Not developed | | | | | | | |
| Comparative Example 3 | Not developed | | | | | | | |
| Example 8 | 72 | ○ | 0.6 | 61 | 53 | 58 | 48 | ○ |
| Example 9 | 53 | ○ | 0.6 | 68 | 60 | 63 | 43 | ○ |
| Example 10 | 55 | ○ | 0.4 | 69 | 67 | 68 | 40 | ○ |
| Comparative Example 4 | 85 | ○ | 1.1 | 64 | 43 | 61 | 44 | ○ |

To obtain the data in Table 4, the characteristics of the samples were evaluated in the manner mentioned below.

Relief Profile:
 ○: This was faithful to negative image.
 Δ: Some relief edges were broken.
 X: Relief was not reproduced.

Degree of Swelling of Plate with Water:
 After having been dipped in water for 24 hours, the increase in the weight of the sample was measured. The smaller values indicate that the samples have good resistance to aqueous ink.

Shore A Hardness:
 A: Hardness of the sample at 25° C.
 B: Hardness of the sample at 80° C.
 C: Hardness of the sample, after having been dipped in water for 24 hours.

Modulus of Rubber Elasticity:
 An iron ball of 5.8 g was dropped onto the sample, and the height of the rebounded ball was measured in terms of percentage relative to the original height from which the ball was dropped.

Flexographic Printing Test:
 ○: Neither the relief edges nor the relief surface changed after the test.
 Δ: The relief edges and the relief surface were partly broken.
 X: The relief edges and the relief surface were much broken.

From the data obtained above, it is understood that the photosensitive resin composition of the present invention, which comprises a polymer having an ionic group and having a polymerizable group in the side chain, gives a photosensitive layer of which the hardness is hardly influenced by the ambient temperature and the presence of water. In addition, the printing plate material having the photosensitive layer of the composition of the invention is developable with an aqueous developer, and the developed layer has good resistance to aqueous ink.

What is claimed is:

1. A photosensitive resin composition comprising (A1) a polymer having an anionic group and a side chain having a polymerizable group without a cationic group, (A2) a polymer having a cationic group and a side chain having a polymerizable group without having an anionic group, wherein the component (A2) has a number-average molecular weight of 1000 or larger, and (B) a photo-polymerization initiator.

2. The photosensitive resin composition as claimed in claim 1, wherein said anionic group in said component (A1) is present in an amount of from 500 to 4,000 g/mol.

3. The photosensitive resin composition as claimed in claim 1, wherein said polymerizable group in said component (A1) is present in an amount of from 1000 to 15,000 g/mol.

4. The photosensitive resin composition as claimed in claim 1, wherein said anionic group in said component (A1) is one or more groups selected from the group consisting of a carboxyl group, a phenolic hydroxyl group, a sulfonic acid group, and a phosphoric acid group.

5. The photosensitive resin composition as claimed in claim 1, wherein said polymer (A1) having an anionic group and having a polymerizable group in said side chain is a linear or grafted polymer.

6. The photosensitive resin composition as claimed in claim 1, wherein said polymer (A2) is a polymer wherein said cationic group is an amino group.

7. The photosensitive resin composition as claimed in claim 6, wherein said amino-group containing polymer (A2) is a tertiary amino group.

8. The photosensitive resin composition as claimed in claim 1, wherein said polymerizable group, of polymer (A2) in said side chain, is a functional group capable of being crosslinked through photopolymerization.

9. The photosensitive resin composition as claimed in claim 8, wherein said polymerizable functional group is a (meth)acryloyl group.

10. A printing plate material having, on a support, a photosensitive layer of the photosensitive resin composition of claim 1.

11. A method for producing a printing plate, which comprises selectively irradiating said printing plate material of claim 10, and then developing it with neutral water.

12. A flexographic printing plate formed from a support and a layer of a photosensitive resin composition as claimed in claim 1 selectively irradiated with light and developed with neutral water.

13. The photosensitive resin composition as claimed in claim 1, further comprising at least one additive selected from the group consisting of dyes, pigments, ultraviolet absorbents, fragrances, polymerization inhibitors and polyenes.

14. A photosensitive resin composition comprising (A1) a polymer having an anionic group and a side chain having a polymerizable group without a cationic group, (A2) a polymer having a cationic group and a side chain having a polymerizable group without having an anionic group, wherein the component (A2) has a number-average molecular weight of 1000 or larger, (B) a photo-polymerization initiator, (C) an ethylenic unsaturated monomer and (D) compound having a cationic-group.

15. The photosensitive resin composition as claimed in claim 14, wherein said cationic group (D) is an amino group.

16. The photosensitive resin composition as claimed in claim 14, containing component (A1) from 10 to 70% by weight, that of the component (A2) from 1 to 60% by weight, that of component (B) from 0.1 to 10% by weight, that of component (C) from 10 to 50% by weight, and that of component (D) from 0.1 to 20% by weight, relative to the total weight of the composition.

17. The photosensitive resin composition as claimed in claim 14, further comprising a plasticizer in an amount of 3 to 40% by weight relative to the total weight of the composition.

18. The photosensitive resin composition as claimed in claim 14, further comprising an elastomer that is solid at room temperature, present in an amount of 1 to 50% by weight, relative to the total weight of the composition.

19. A photosensitive resin comprising (A1) an anionic polymer having an anionic group and a side chain having a polymerizable group without having a cationic group, (A2) a cationic polymer having a cationic group and a side chain having a polymerizable group without having an anionic group, and (B) a photo-polymerization initiator, wherein said photosensitive resin composition is capable of serving as a printing plate material developable with neutral water.

* * * * *

UNITED STATES PATENT AND TRADEMARK OFFICE
CERTIFICATE OF CORRECTION

PATENT NO. : 6,159,658  Page 1 of 1
DATED : December 12, 2000
INVENTOR(S) : Tanaka et al.

It is certified that error appears in the above-identified patent and that said Letters Patent is hereby corrected as shown below:

Column 12,
Line 67, please change "400°" to -- 40° --.

Signed and Sealed this

First Day of October, 2002

*Attest:*

JAMES E. ROGAN
*Attesting Officer*   *Director of the United States Patent and Trademark Office*